(12) United States Patent
Maki

(10) Patent No.: US 8,237,508 B2
(45) Date of Patent: Aug. 7, 2012

(54) POWER AMPLIFIER

(75) Inventor: Suguru Maki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/082,431

(22) Filed: Apr. 8, 2011

(65) Prior Publication Data
US 2012/0032744 A1 Feb. 9, 2012

(30) Foreign Application Priority Data
Aug. 5, 2010 (JP) .................... 2010-176230

(51) Int. Cl.
*H03F 3/04* (2006.01)

(52) U.S. Cl. ....................... 330/296; 330/285

(58) Field of Classification Search ........... 330/285, 330/296
See application file for complete search history.

(56) References Cited

U.S. PATENT DOCUMENTS

| 7,012,469 | B2 | 3/2006 | Moriwaki et al. |
| 7,408,412 | B2 | 8/2008 | Yamamoto et al. |
| 7,439,809 | B2 | 10/2008 | Iwata et al. |
| 7,692,490 | B2 * | 4/2010 | Cho et al. ............. 330/296 |

FOREIGN PATENT DOCUMENTS

| JP | 2004-274433 A | 9/2004 |
| JP | 2006-303744 A | 11/2006 |
| JP | 2007-81561 A | 3/2007 |

* cited by examiner

*Primary Examiner* — Hieu Nguyen
(74) *Attorney, Agent, or Firm* — Leydig, Voit & Mayer, Ltd.

(57) ABSTRACT

A power amplifier comprises: an amplifier transistor; a bias circuit supplying bias current to the amplifier transistor; and a collector voltage terminal connected to a collector of the amplifier transistor. The bias circuit includes: a reference voltage terminal into which a reference voltage is input; a power terminal connected to a power source; a transistor having a control terminal connected to the reference voltage terminal, a first terminal connected to the power terminal, and a second terminal that is grounded. The transistor supplies a bias current corresponding to the reference voltage to the amplifier transistor; a variable capacitor connected between the first terminal and a grounding point; and a logic circuit controlling capacitance of the variable capacitor.

2 Claims, 5 Drawing Sheets

POWER AMPLIFIER

BACKGROUND OF THE INVENTION

1. Field of the Invention

The present invention relates to a transmitting power amplifier for collector voltage boosting mobile terminals, and specifically to a power amplifier capable of improving distortion characteristics in a linear operation region.

2. Background Art

In a mobile terminal of a CDMA (Code Division Multiple Access) or the like, a power amplifier for amplifying transmission signals is used (for example, refer to Japanese Patent Laid-Open No. 2007-81561). The power amplifier comprises amplifier transistors, matching circuits for transforming impedance before and after amplifier transistors, and a bias circuit for setting the bias points of the amplifier transistors.

The matching circuits and the bias circuit have been tuned for basic modulation used in telephone calls or the like. Conventionally, for modulation of a high peak power used in high-speed data communications other than basic modulation, the matching circuit or bias circuit has not been changed, but only the collector voltage of the amplifier transistor has been elevated.

SUMMARY OF THE INVENTION

There has been a problem wherein although distortion characteristics in the non-linear operation region can be improved only by elevating collector voltage, this has no effect or rather shows deterioration in the linear operation region.

In view of the above-described problems, an object of the present invention is to provide a power amplifier capable of improving distortion characteristics in a linear operation region.

According to the present invention, a power amplifier comprises: an amplifier transistor; a bias circuit supplying bias current to the amplifier transistor; and a collector voltage terminal connected to a collector of the amplifier transistor, wherein the bias circuit includes: a reference voltage terminal into which a reference voltage is inputted; a power terminal connected to a power source; a transistor having a control terminal connected to the reference voltage terminal, a first terminal connected to the power terminal, and a second terminal grounded, the transistor supplying bias current corresponding to the reference voltage to the amplifier transistor; a variable capacitor connected between the first terminal of the transistor and a grounding point; and a logic circuit controlling a capacitance value of the variable capacitor, and wherein when a collector voltage supplied to the collector voltage terminal is higher than a prescribed voltage, the logic circuit increases the capacitance value of the variable capacitor to be greater than the case wherein the collector voltage is equal to or lower than the prescribed voltage.

The present invention makes it possible to improve distortion characteristics in a linear operation region.

Other and further objects, features and advantages of the invention will appear more fully from the following description.

DETAILED DESCRIPTION OF THE PREFERRED EMBODIMENTS

A power amplifier according to the embodiments of the present invention will be described with reference to the drawings. The same components will be denoted by the same symbols, and the repeated description thereof may be omitted.

First Embodiment

Figure 1:
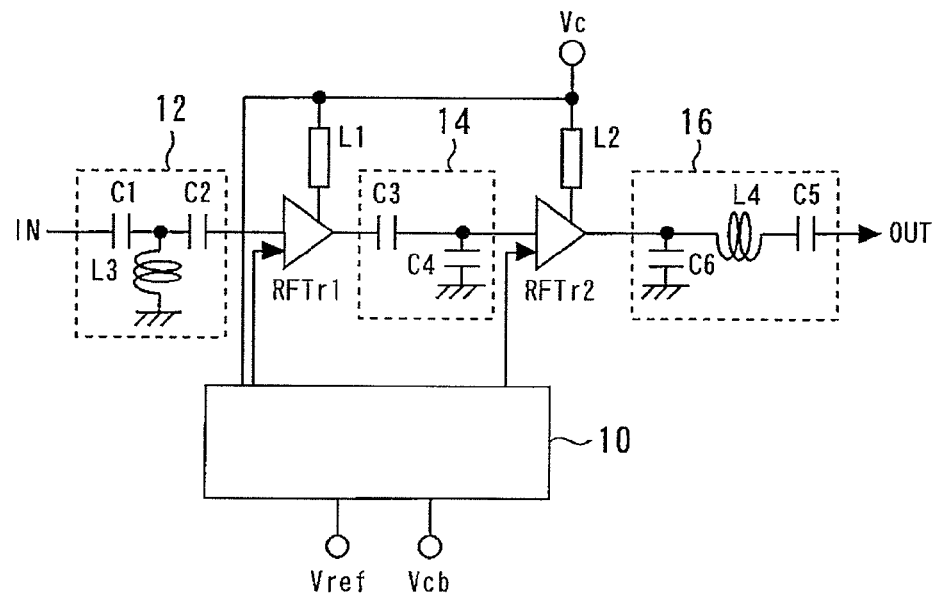
FIG. 1 is a diagram showing a power amplifier according to a first embodiment of the present invention.

FIG. 1 is a diagram showing a power amplifier according to a first embodiment of the present invention. Amplifier transistors RFTr1 and RFTr2 are hetero-junction bipolar transistors for power amplification, and they are initial stage and final stage transistors, respectively. A bias circuit 10 supplies bias current to amplifier transistors RFTr1 and RFTr2. The collectors of the amplifier transistors RFTr1 and RFTr2 are connected to a collector voltage terminal Vc via inductors L1 and L2, respectively.

An input matching circuit 12 is connected between an input terminal IN and the amplifier transistor RFTr1. The input matching circuit 12 comprises series-connected capacitors C1 and C2, an inductor L3 connected between the connecting point of the capacitors C1 and C2 and the grounding point. An inter-stage matching circuit 14 is connected between the amplifier transistor RFTr1 and the amplifier transistor RFTr2. The inter-stage matching circuit 14 comprises a capacitor C3, and a capacitor C4 connected between the capacitor C3 and the grounding point. An output matching circuit 16 is connected between the amplifier transistor RFTr2 and an output terminal OUT. The output matching circuit 16 comprises series-connected inductor L4 and capacitor C5, and a capacitor C6 connected between the inductor L4 and the grounding point. These matching circuits perform impedance conversion before and after the amplifier transistor RFTr1 and RFTr2.

Figure 2:
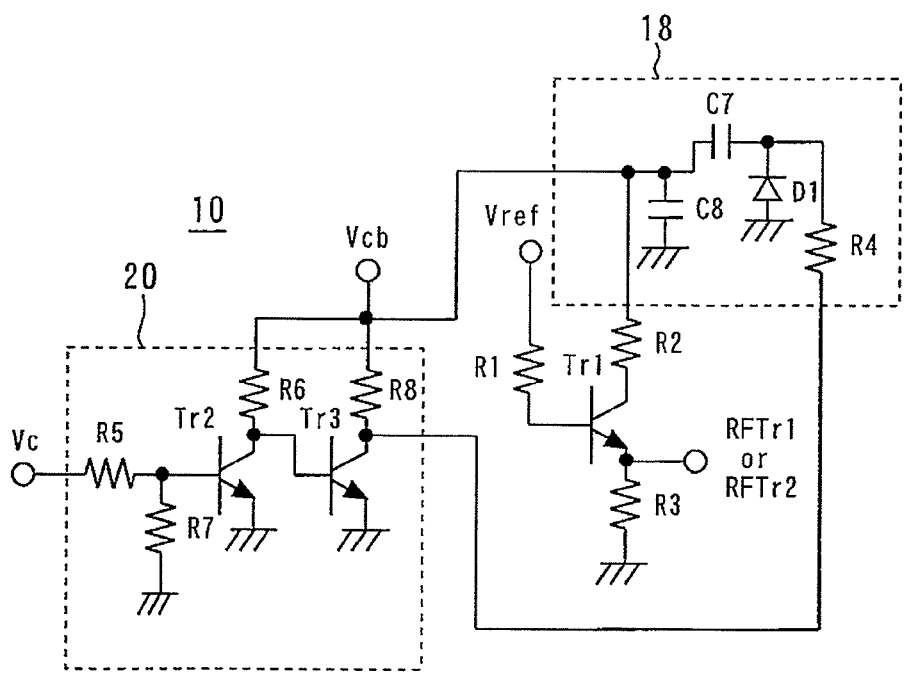
FIG. 2 is a diagram showing a bias circuit according to the first embodiment of the present invention.

FIG. 2 is a diagram showing a bias circuit according to the first embodiment of the present invention. A reference voltage is inputted into a reference voltage terminal Vref, and a power terminal Vcb is connected to the power source. The base (control terminal) of the transistor Tr1 is connected to the reference voltage terminal Vref via a resistor R1, the collector (first terminal) is connected to the power terminal Vcb via the resistor R2, and the emitter (second terminal) is grounded via the resistor R3. The transistor Tr1 supplies a bias current corresponding to the reference voltage to amplifier transistors RFTr1 and RFTr2.

A variable capacitor 18 is connected between the collector of the transistor Tr1 and the grounding point. The capacitance value of the variable capacitor 18 is controlled by a logic circuit 20. The variable capacitor 18 comprises a diode D1, capacitors C7 and C8, and a resistor R4. The anode of the diode D1 is grounded, and the cathode is connected to the output of the logic circuit 20 via the resistor R4, and also connected to the collector of the transistor Tr1 via the capacitor C7 and the resistor R2. The capacitor C8 is connected between the resistor R2 and the grounding point.

The logic circuit 20 comprises transistors Tr2 and Tr3, and resistors R5, R6, R7, and R8. The base of the transistor Tr2 is connected to a collector voltage terminal Vc via the resistor R5, the collector is connected to the power terminal Vcb via the resistor R6, and the emitter is grounded. The resistor R7 is connected between the base of the transistor Tr2 and the grounding point. The base of the transistor Tr3 is connected to the collector of the transistor Tr2, the collector is connected to the power terminal Vcb via the resistor R8, and the emitter is grounded.

Next, the operation of the power amplifier according to the first embodiment will be described. The collector voltage inputted from the collector voltage terminal Vc is switched corresponding to modulation. Specifically, the collector voltage is set to 3.5V in basic modulation used in telephone calls and the like, and is set to 4.0 V in modulation having a high peak power used in high-speed data communications. Thereby, the distortion characteristics in the non-linear operation region can be improved.

The logic circuit 20 monitors the switching of the collector voltage, and outputs a high or low voltage. When the collector voltage is the normal voltage (prescribed voltage) or lower, the resistances of resistors R5 and R7 are set so that the base voltage of the transistor Tr2 is not higher than the threshold voltage. Therefore, when the collector voltage is the normal voltage or lower, the collector current of the transistor Tr2 is zero. Voltage drop by the resistor R6 is reduced, and the base voltage of the transistor Tr3 becomes the threshold voltage thereof or higher. Therefore, the transistor Tr3 is turned ON, and the logic circuit 20 outputs a low voltage. When the low voltage is supplied to the cathode of the diode D1, the capacitance by the diode D1 is lowered.

On the other hand, when the collector voltage is higher than the normal voltage, the logic circuit 20 outputs a high voltage. When the high voltage is supplied to the cathode of the diode D1 the capacitance by the diode D1 is enlarged.

As described above, when the collector voltage supplied to the collector voltage terminal Vc is higher than the prescribed voltage, the logic circuit 20 increases the capacitance value of the variable capacitor 18 to be greater than the case wherein the collector voltage is equal to or lower than the prescribed voltage.

When the capacitance of the variable capacitor 18 is enlarged, since the collector capacitance of the transistor Tr1 becomes higher, the impedance of the bias circuit 10 side viewed from amplifier transistors RFTr1 and RFTr2 becomes lower. On the contrary, when the capacitance of the variable capacitor 18 is reduced, since the collector capacitance of the transistor Tr1 becomes lower, the impedance of the bias circuit 10 side viewed from amplifier transistors RFTr1 and RFTr2 becomes higher.

Figure 3:
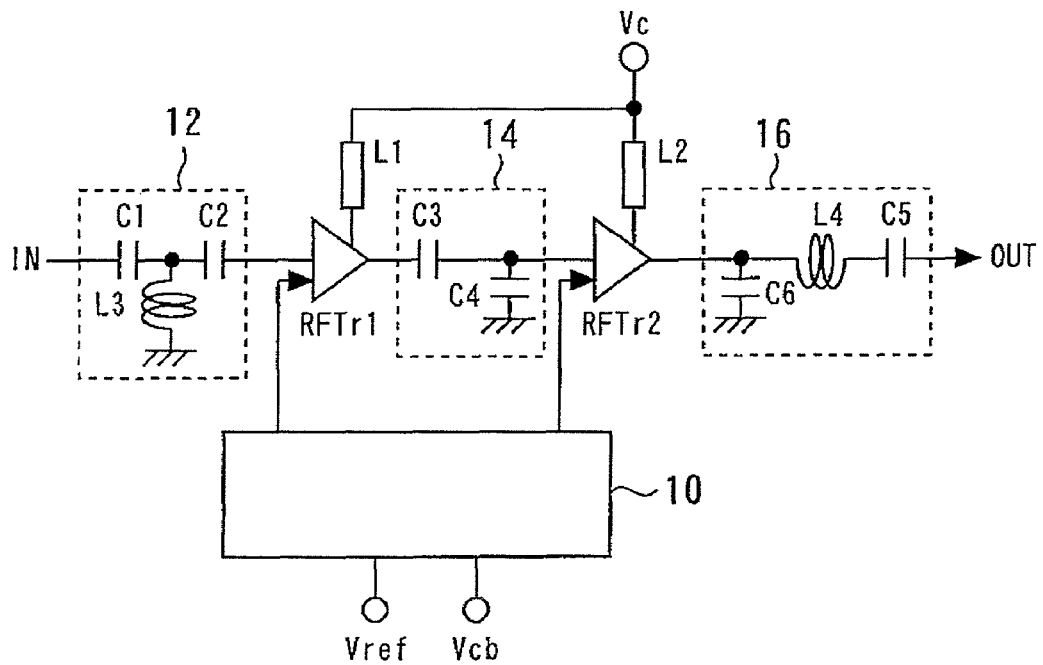
FIG. 3 is a diagram showing a power amplifier according to the comparative example.
Figure 4:
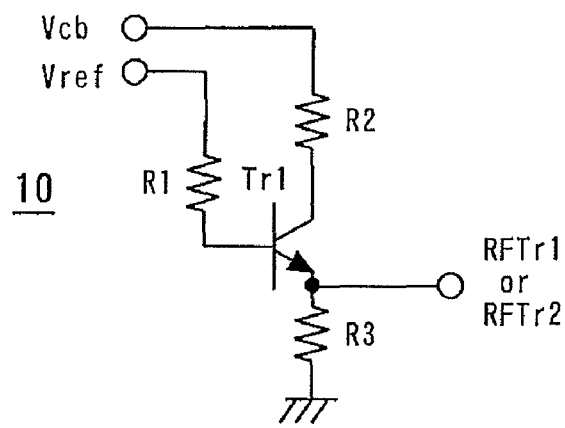
FIG. 4 is a diagram showing a bias circuit according to the comparative example.

Next, the effect of the first embodiment will be described in comparison with the comparative example. FIG. 3 is a diagram showing a power amplifier according to the comparative example. FIG. 4 is a diagram showing a bias circuit according to the comparative example. In comparison with the bias circuit in the first embodiment, the variable capacitor 18 or the logic circuit 20 are omitted. In the comparative example, the bias circuit is not varied corresponding to the collector voltage. By switching the collector voltage corresponding to modulation, the distortion characteristics in the non-linear operation region can be improved. However, this has no effect or rather shows deterioration in the linear operation region.

On the other hand, in the first embodiment, the collector capacitance of the transistor Tr1 is varied corresponding to the collector voltage to optimize the impedance in the bias circuit side. Thereby, Not only the distortion characteristics in the non-linear operation region (high-output operation region), but also distortion characteristics in the non-linear operation region in the linear operation region (intermediate- or low-output operation region) can be improved.

Second Embodiment

Figure 5:
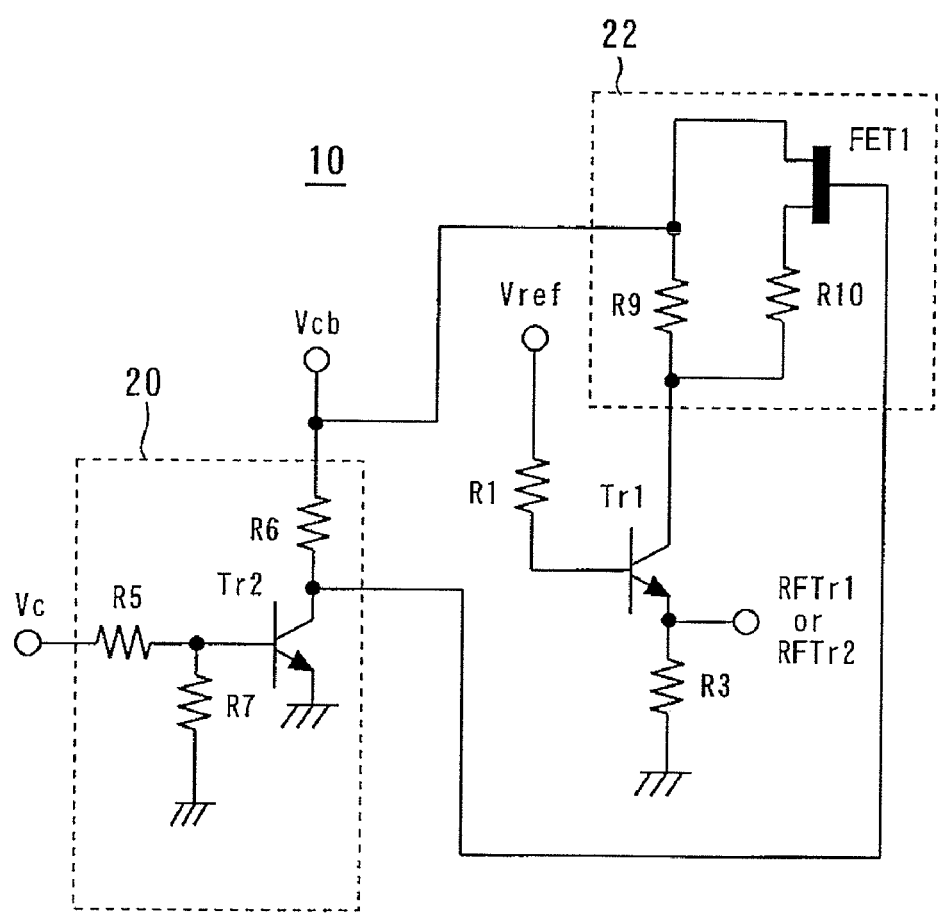
FIG. 5 is a diagram showing a bias circuit according to the second embodiment of the present invention.

The power amplifier according to a second embodiment of the present invention is different from the power amplifier according to the first embodiment in the configuration of the bias circuit. FIG. 5 is a diagram showing a bias circuit according to the second embodiment of the present invention. In the bias circuit according to the second embodiment, a variable resistor 22 is connected between the power terminal Vcb and the collector of the transistor Tr1 in place of the variable capacitor 18 and the resistor R2 in the first embodiment. The variable resistor 22 comprises parallelly-connected resistors R9 and R10, and a transistor FET1 serially-connected to the resistor R10. In addition, the logic circuit 20 according to the second embodiment has no transistor Tr3 and resistor R8 as in the first embodiment.

Next, the operation of the bias circuit according to the second embodiment will be described. When the collector voltage supplied to the collector voltage terminal Vc is the normal voltage (prescribed voltage) or lower, the logic circuit 20 outputs a high voltage. When the high voltage (threshold voltage or higher) is supplied to the gate of the transistor FET1, the transistor FET1 operates and the resistance of the variable resistor 22 is reduced.

On the contrary, when the collector voltage is higher than the normal voltage, the logic circuit 20 outputs a low voltage. When the low voltage (lower than threshold voltage) is supplied to the gate of the transistor FET1, the transistor FET1 does not operate, and the resistance of the variable resistor 22 becomes high.

As described above, the logic circuit 20 controls the resistance of the variable resistor 22, and when the collector voltage is higher than the normal voltage, the logic circuit 20 increases the resistance of the variable resistor 22 to be higher than the voltage when the collector voltage is equal to or lower than the normal voltage.

When the resistance of the variable resistor 22 becomes low, the bias points of the amplifier transistors RFTr1 and RFTr2 become high. On the other hand, when the resistance of the variable resistor 22 becomes high, the bias points of the amplifier transistors RFTr1 and RFTr2 become low.

As described above, in the second embodiment, the bias points of the amplifier transistors RFTr1 and RFTr2 are optimized by varying the collector resistance of the transistor Tr1 corresponding to the collector voltage. Thereby, not only the distortion characteristics in the non-linear operation region (high-output operation region), but also the distortion characteristics in the linear operation region (intermediate- or low-output operation region) can be improved.

Third Embodiment

Figure 6:
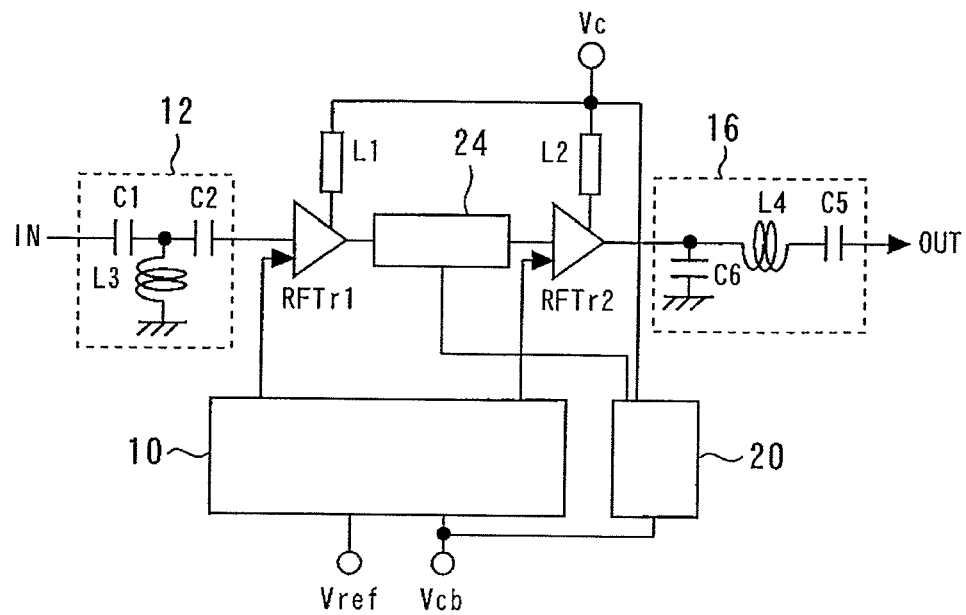
FIG. 6 is a diagram showing a power amplifier according to a third embodiment of the present invention.

FIG. 6 is a diagram showing a power amplifier according to a third embodiment of the present invention. A variable capacitor 24 is installed between the amplifier transistor RFTr1 and the amplifier transistor RFTr2 in place of the inter-stage matching circuit 14 in the first embodiment, and a logic circuit 20 for controlling the capacitance of the variable capacitor 24 is installed.

Figure 7:
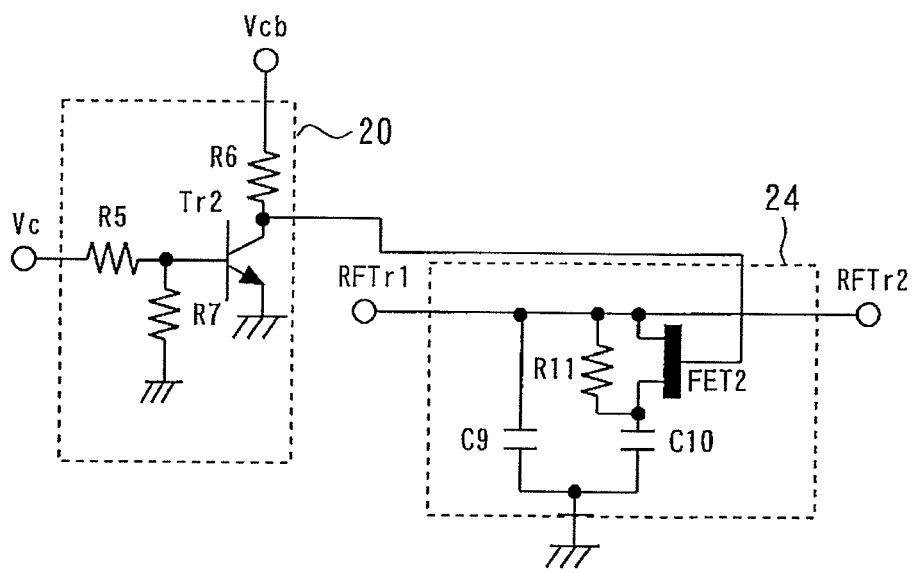
FIG. 7 is a diagram showing a variable capacitor and a logic circuit according to the third embodiment of the present invention.

FIG. 7 is a diagram showing a variable capacitor and a logic circuit according to the third embodiment of the present invention. The structure of the logic circuit 20 is identical to the structure in the second embodiment. The variable capacitor 24 is connected between the output of the amplifier transistor RFTr1 and the grounding point. The variable capacitor 24 comprises parallelly-connected capacitors C9 and C10, a resistor R11 and transistor FET2 serially-connected to the capacitor C10.

Next, the operation of the power amplifier according to the third embodiment will be described. When the collector voltage supplied to the collector voltage terminal Vc is the normal voltage (prescribed voltage) or lower, the logic circuit 20 outputs a high voltage. When the high voltage (threshold voltage or higher) is supplied to the gate of the transistor FET2, the transistor FET2 operates and the capacitance of the variable capacitor 24 becomes high.

On the contrary, when the collector voltage is higher than the normal voltage, the logic circuit 20 outputs a low voltage. When the low voltage (lower than the threshold voltage) is supplied to the gate of the transistor FET2, the transistor FET2 does not operate, and the capacitance of the variable capacitor 24 becomes low.

As described above, the logic circuit 20 controls the capacitance value of the variable capacitor 24, and when the collector voltage is higher than the normal voltage, the logic circuit 20 lowers the capacitance value of the variable capacitor 24 to be lower than the value when the collector voltage is equal to or lower than the normal voltage.

When the capacitance of the variable capacitor 24 is enlarged, the output load impedance of the amplifier transistor RFTr1 is lowered. On the contrary, when the capacitance of the variable capacitor 24 is lowered, the output load impedance of the amplifier transistor RFTr1 is elevated.

As described above, in the third embodiment, the capacitance of the variable capacitor 24 is changed depending on the collector voltage to optimizing the output load impedance of the amplifier transistor RFTr1. Thereby, not only the distortion characteristics in the non-linear operation (high-output operation) region, but also the distortion characteristics in the linear operation (intermediate- or low-output operation) region can be improved.

Fourth Embodiment

Figure 8:
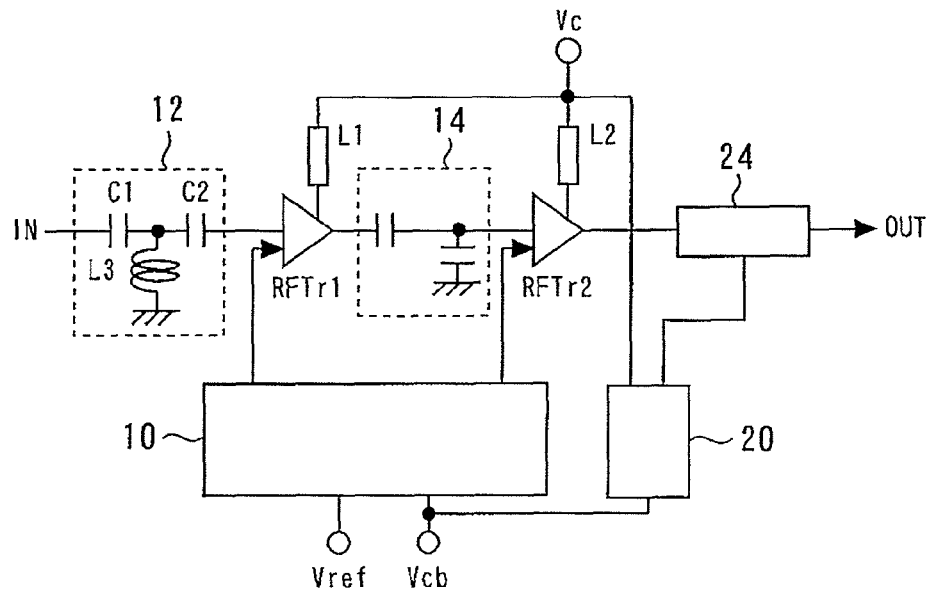
FIG. 8 is a diagram showing a power amplifier according to a fourth embodiment of the present invention.

FIG. 8 is a diagram showing a power amplifier according to a fourth embodiment of the present invention. A variable capacitor 24 is installed between the amplifier transistor RFTr2 and the output terminal OUT, in place of output matching circuit 16 in the first embodiment, and the logic circuit 20 for controlling the capacitance of the variable capacitor 24 is installed.

Figure 9:
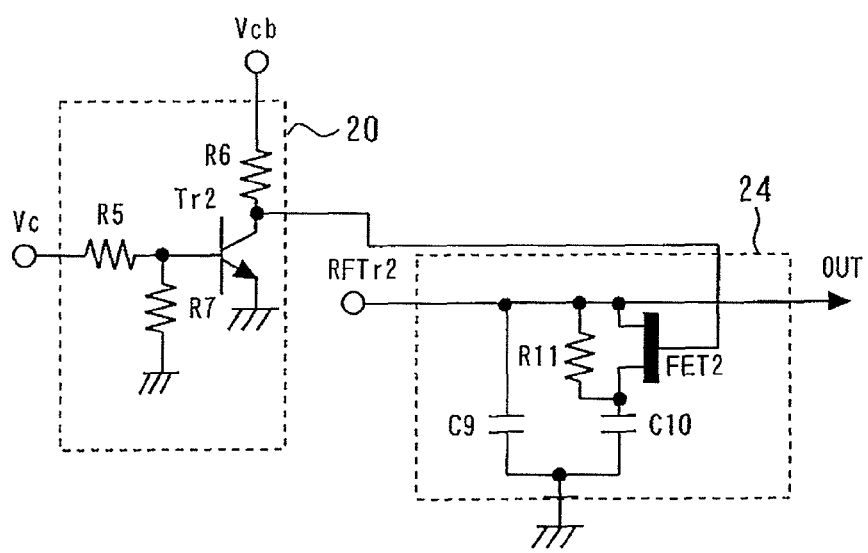
FIG. 9 is a diagram showing the variable capacitor and the logic circuit according to the fourth embodiment of the present invention.

FIG. 9 is a diagram showing the variable capacitor and the logic circuit according to the fourth embodiment of the present invention. The structure of the logic circuit 20 is identical to the logic circuit 20 in the second embodiment. The variable capacitor 24 is connected between the output of the amplifier transistor RFTr2 and the grounding point. The structure of the variable capacitor 24 is identical to the structure in the third embodiment. The operation of the logic circuit 20 and the variable capacitor 24 is identical to the operation in the third embodiment.

As described above, in the fourth embodiment, the capacitance of the variable capacitor 24 is changed depending on the collector voltage to optimizing the output load impedance of the amplifier transistor RFTr2. Thereby, not only the distortion characteristics in the non-linear operation (high-output operation) region, but also the distortion characteristics in the linear operation (intermediate- or low-output operation) region can be improved.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-176230, filed on Aug. 5, 2010 including specification, claims, drawings and summary, on which the Convention priority of the present application is based, are incorporated herein by reference in its entirety.

What is claimed is:

1. A power amplifier comprising:
an amplifier transistor having a collector;
a bias circuit supplying bias current to the amplifier transistor; and
a collector voltage terminal connected to the collector of the amplifier transistor, wherein the bias circuit includes:
a reference voltage terminal into which a reference voltage is input,
a power terminal connected to a power source,
a transistor having a control terminal connected to the reference voltage terminal, a first terminal connected to the power terminal, and a second terminal that is grounded, the transistor supplying a bias current corresponding to the reference voltage to the amplifier transistor,
a variable capacitor connected between the first terminal of the transistor and a grounding point, and
a logic circuit controlling capacitances of the variable capacitor, and, when a collector voltage supplied to the collector voltage terminal is higher than a prescribed voltage, the logic circuit increases the capacitance of the variable capacitor to be larger than when the collector voltage is not higher than the prescribed voltage.

2. The power amplifier according to claim 1, wherein,
when the collector voltage is higher than the prescribed voltage, the logic circuit outputs a high voltage,
when the collector voltage is not higher than the prescribed voltage, the logic circuit outputs a low voltage, and
the variable capacitor has an anode that is grounded and a cathode connected to an output of the logic circuit and connected to the first terminal of the transistor.

* * * * *